(12) United States Patent
Chen et al.

(10) Patent No.: US 11,329,368 B2
(45) Date of Patent: May 10, 2022

(54) COMMUNICATION DEVICE

(71) Applicant: Quanta Computer Inc., Taoyuan (TW)

(72) Inventors: Chun-I Chen, Taoyuan (TW);
Chun-Yuan Wang, Taoyuan (TW);
Bang-Yun Dai, Taoyuan (TW);
Chih-Tsung Tseng, Taoyuan (TW);
Chung-Ting Hung, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 332 days.

(21) Appl. No.: 16/801,515

(22) Filed: Feb. 26, 2020

(65) Prior Publication Data

US 2021/0218400 A1 Jul. 15, 2021

(30) Foreign Application Priority Data

Jan. 9, 2020 (TW) .................... 109100681

(51) Int. Cl.
*H01Q 1/24* (2006.01)
*H01Q 5/392* (2015.01)
*H01Q 19/00* (2006.01)
*H01Q 21/30* (2006.01)
*H01Q 9/42* (2006.01)

(52) U.S. Cl.
CPC ............ *H01Q 1/245* (2013.01); *H01Q 5/392* (2015.01); *H01Q 9/42* (2013.01); *H01Q 19/005* (2013.01); *H01Q 21/30* (2013.01); *H01Q 1/243* (2013.01); *H03K 2217/960765* (2013.01)

(58) Field of Classification Search
CPC ...... H01Q 1/243; H01Q 21/30; H01Q 19/005; H01Q 9/42; H01Q 5/392; H01Q 1/245
See application file for complete search history.

(56) References Cited

U.S. PATENT DOCUMENTS

| 9,502,768 | B2 | 11/2016 | Huang |
| 9,548,532 | B2 | 1/2017 | Chiang |
| 9,947,996 | B2 | 4/2018 | Chou et al. |

FOREIGN PATENT DOCUMENTS

| TW | 201307857 A | 2/2013 |
| TW | M460421 U | 8/2013 |
| TW | 201530909 A | 8/2015 |

OTHER PUBLICATIONS

Chinese language office action dated Nov. 11, 2021, issued in application No. TW 109100681.

*Primary Examiner* — Graham P Smith
(74) *Attorney, Agent, or Firm* — McClure, Qualey & Rodack, LLP

(57) ABSTRACT

A communication device with an RF (Radio Frequency) node and a detection node includes a first radiation element, a second radiation element, a first inductor, a second inductor, a third inductor, a first capacitor, and a second capacitor. The first radiation element is coupled to a first node. The second radiation element is coupled to a second node. The first inductor is coupled between the RF node and the ground voltage. The first capacitor is coupled between the RF node and the first node. The second inductor is coupled between the first node and the second node. The second capacitor is coupled between the second node and the ground voltage. The third inductor is coupled between the detection node and the second node. An antenna structure and a sensing pad are formed by the first radiation element and the second radiation element.

10 Claims, 3 Drawing Sheets

COMMUNICATION DEVICE

CROSS REFERENCE TO RELATED APPLICATIONS

This application claims priority of Taiwan Patent Application No. 109100681 filed on Jan. 9, 2020, the entirety of which is incorporated by reference herein.

BACKGROUND OF THE INVENTION

Field of the Invention

The disclosure generally relates to a communication device, and more specifically, to a communication device configured as both an antenna and a sensing pad.

Description of the Related Art

As mobile communication technology has progressed, mobile devices like portable computers, mobile phones, tablet computers, multimedia players, and other hybrid functional portable electronic devices have become more common. To satisfy the needs of users, mobile devices can usually perform wireless communication functions. Some functions cover a large wireless communication area; for example, mobile phones using 2G, 3G, and LTE (Long Term Evolution) systems and using frequency bands of 700 MHz, 850 MHz, 900 MHz, 1800 MHz, 1900 MHz, 2100 MHz, 2300 MHz, and 2500 MHz. Some functions cover a small wireless communication area; for example, mobile phones using Wi-Fi and Bluetooth systems and using frequency bands of 2.4 GHz, 5.2 GHz, and 5.8 GHz.

A conventional mobile device usually includes an antenna and a sensing pad, which are separate from each other, so as to support wireless communication and adjustment of radiation power. However, since there is a limited amount of space in a mobile device, the aforementioned antenna and sensing pad may be very close to each other, and this can lead to interference and poor radiation efficiency of the antenna. Accordingly, there is a need to design a novel mobile communication device for solving the problems of the prior art.

BRIEF SUMMARY OF THE INVENTION

In a preferred embodiment, the invention is directed to a communication device with an RF (Radio Frequency) node and a detection node. The communication device includes a first radiation element, a second radiation element, a first inductor, a second inductor, a third inductor, a first capacitor, and a second capacitor. The first radiation element is coupled to a first node. The second radiation element is coupled to a second node. The first inductor is coupled between the RF node and the ground voltage. The first capacitor is coupled between the RF node and the first node. The second inductor is coupled between the first node and the second node. The second capacitor is coupled between the second node and the ground voltage. The third inductor is coupled between the detection node and the second node. An antenna structure and a sensing pad are formed by the first radiation element and the second radiation element.

In some embodiments, the second radiation element is adjacent to and separate from the first radiation element, such that the antenna structure is classified as a coupled-fed antenna structure.

In some embodiments, the first radiation element is a meandering structure.

In some embodiments, the second radiation element is a bifurcation structure.

In some embodiments, the second radiation element defines a concave region. The first radiation element at least partially extends into the concave region.

In some embodiments, a coupling gap is formed between the second radiation element and the first radiation element. The width of the coupling gap is shorter than or equal to 2 mm.

In some embodiments, the antenna structure covers a first frequency band and a second frequency band. The first frequency band is from 698 MHz to 760 MHz. The second frequency band is from 1710 MHz to 2600 MHz.

In some embodiments, the length of the first radiation element is shorter than or equal to 0.25 wavelength of the first frequency band.

In some embodiments, the inductance of the first inductor is about 82 nH. The inductance of each of the second inductor and the third inductor is from 180 nH to 220 nH.

In some embodiments, the capacitance of each of the first capacitor and the second capacitor is lower than or equal to 15 pF.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

Figure 1:
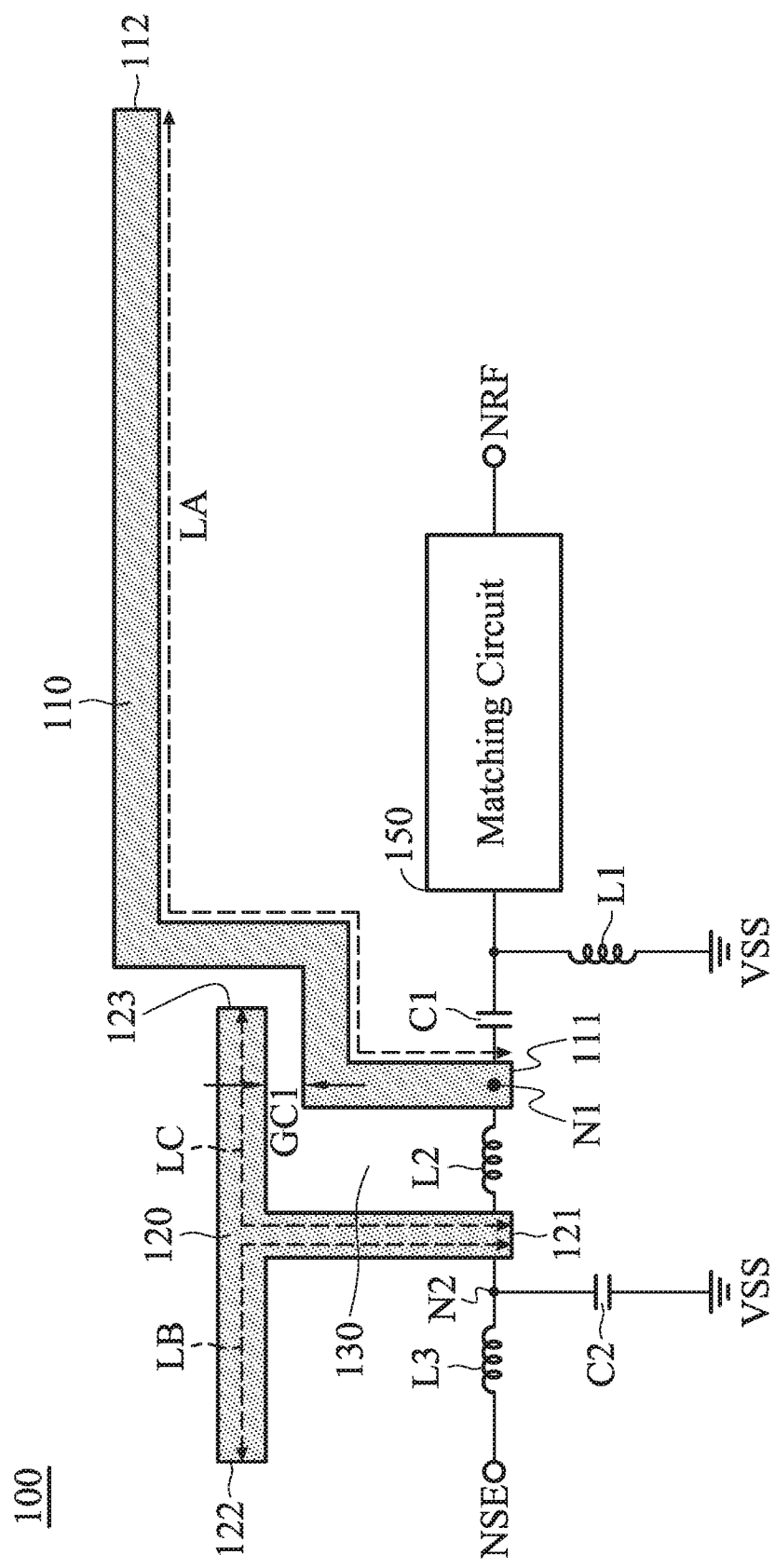
FIG. 1 is a diagram of a communication device according to an embodiment of the invention.

In order to illustrate the purposes, features and advantages of the invention, the embodiments and figures of the invention are shown in detail as follows.

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". The term "substantially" means the value is within an acceptable error range. One skilled in the art can solve the technical problem within a predetermined error range and achieve the proposed technical performance. Also, the term "couple" is intended to mean either an indirect or direct electrical connection. Accordingly, if one device is coupled to another device, that connection may be through a direct electrical connection, or through an indirect electrical connection via other devices and connections.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1 is a diagram of a communication device 100 according to an embodiment of the invention. For example, the communication device 100 may be a smart phone, a tablet computer, or a notebook computer. As shown in FIG. 1, the communication device 100 with an RF (Radio Frequency) node NRF and a detection node NSE at least includes a first radiation element 110, a second radiation element 120, a first inductor L1, a second inductor L2, a third inductor L3, a first capacitor C1, and a second capacitor C2. The first radiation element 110 and the second radiation element 120 may be made of metal materials, such as copper, silver, aluminum, iron, or their alloys. In a preferred embodiment, an antenna structure and a sensing pad are formed by the first radiation element 110 and the second radiation element 120. The RF node NRF may be further coupled to an RF signal source for exciting the aforementioned antenna structure. The detection node NSE may be further coupled to a proximity sensor (P-sensor) for controlling the aforementioned sensing pad. It should be understood that the communication device 100 may further include other elements, such as a display device, a speaker, a touch control module, a power supply module, and a housing, although they are not displayed in FIG. 1.

The first radiation element 110 may be a meandering structure, such as a W-shape, but it is not limited thereto. Specifically, the first radiation element 110 has a first end 111 and a second end 112. The first end 111 of the first radiation element 110 is coupled to a first node N1. The second end 112 of the first radiation element 110 is an open end.

The second radiation element 120 may be a bifurcation structure, such as a T-shape, but it is not limited thereto. Specifically, the second radiation element 120 has a first end 121, a second end 122, and a third end 123. The first end 121 of the second radiation element 120 is coupled to a second node N2. Each of the second end 122 and the third end 123 of the second radiation element 120 is an open end. The second end 122 and the third end 123 of the second radiation element 120 may substantially extend in opposite directions and away from each other. The third end 123 of the second radiation element 120 and the second end 112 of the first radiation element 110 may substantially extend in the same direction. The second radiation element 120 defines a concave region 130, and the first radiation element 110 at least partially extends into the concave region 130. In some embodiments, the second radiation element 120 is adjacent to and separate from the first radiation element 110, and a coupling gap GC1 is formed between the second radiation element 120 and the first radiation element 110. Thus, the antenna structure of the communication device 100 is classified as a coupled-fed antenna structure. It should be noted that the term "adjacent" or "close" over the disclosure means that the distance (spacing) between two corresponding elements is shorter than a predetermined distance (e.g., 10 mm or shorter), but usually does not mean that the two corresponding elements are touching each other directly (i.e., the aforementioned distance/spacing therebetween is reduced to 0).

In some embodiments, the communication device 100 further includes a matching circuit 150 coupled to the RF node NRF, and the matching circuit 150 is configured to fine-tune the feeding impedance of the antenna structure of the communication device 100. The matching circuit 150 may include one or more inductors and/or one or more capacitors (not shown), such as chip inductors and/or chip capacitors. It should be understood that the matching circuit 150 is not an essential component of the communication device 100, and the matching circuit 150 is omitted in other embodiments.

The first inductor L1 has a first terminal coupled to the RF node NRF (e.g., it may communicate through the matching circuit 150), and a second terminal coupled to the ground voltage VSS. The aforementioned ground voltage VSS may be provided by a system ground plane 100 of the communication device 100 (not shown). The first capacitor C1 has a first terminal coupled to the RF node NRF (e.g., it may communicate through the matching circuit 150), and a second terminal coupled to the first node N1. The second inductor L2 has a first terminal coupled to the first node N1, and a second terminal coupled to the second node N2. The second capacitor C2 has a first terminal coupled to the second node N2, and a second terminal coupled to the ground voltage VSS. The third inductor L3 has a first terminal coupled to the detection node NSE, and a second terminal coupled to the second node N2.

Figure 2:
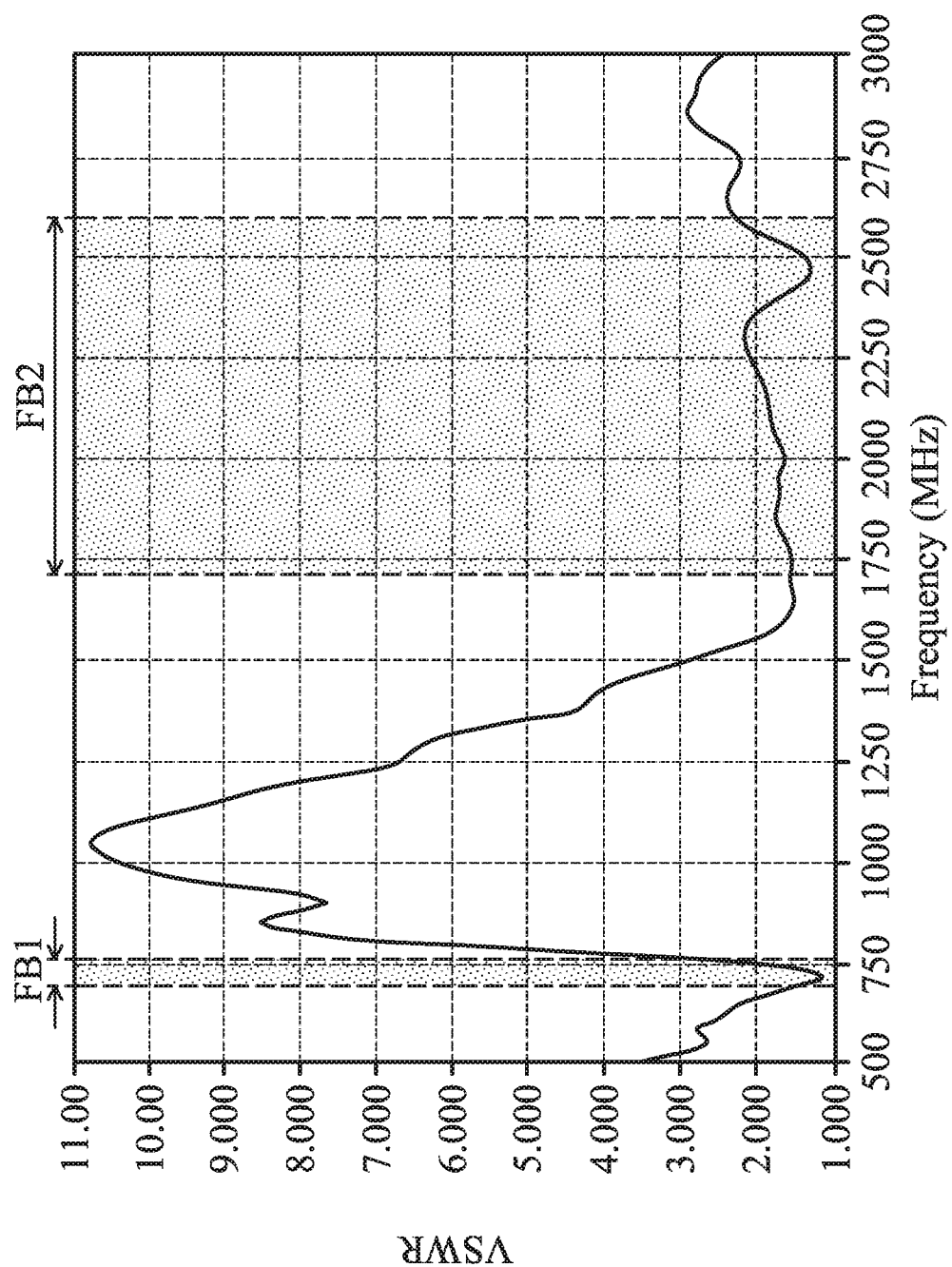
FIG. 2 is a diagram of VSWR (Voltage Standing Wave Ratio) of an antenna structure of a communication device according to an embodiment of the invention.

FIG. 2 is a diagram of VSWR (Voltage Standing Wave Ratio) of the antenna structure of the communication device 100 according to an embodiment of the invention. The horizontal axis represents the operation frequency (MHz), and the vertical axis represents the VSWR. According to the measurement of FIG. 2, the antenna structure of the communication device 100 can cover a first frequency band FB1 and a second frequency band FB2. For example, the first frequency band FB1 may be from 698 MHz to 760 MHz, and the second frequency band FB2 may be from 1710 MHz to 2600 MHz. Therefore, the antenna structure of the communication device 100 can support at least the wideband operation of LTE (Long Term Evolution).

In some embodiments, the operation principles of the communication device 100 are described as follows. With respect to the antenna structure, when the RF node NRF of the communication device 100 is fed by an RF signal source (not shown), the second radiation element 120 is excited by the first radiation element 110 using a coupling mechanism, so as to generate the first frequency band FB1 and the second frequency band FB2. With respect to the sensing pad, when the detection node NSE of the communication device 100 is coupled to a proximity sensor (not shown), the first radiation element 110 and the second radiation element 120 are configured to measure an effective capacitance between itself and an object under test (e.g., a metal object or a human body). In other words, the combination of the first radiation element 110 and the second radiation element 120 has the functions of signal transmission and proximity detection. If the first radiation element 110 and the second radiation element 120 are used as the antenna structure, the first inductor L1, the second inductor L2, and the third inductor L3 will be considered as open-circuited paths, and the first capacitor C1 and the second capacitor C2 will be considered as short-circuited paths. Thus, the high-frequency noise relative to the antenna structure does not tend to interfere with the detection node NSE and the proximity sensor coupled thereto. Conversely, if the first radiation element 110 and the second radiation element 120 are used as the sensing pad, the first inductor L1, the second inductor L2, and the third inductor L3 will be considered as short-circuited paths, and the first capacitor C1 and the second capacitor C2 will be considered as open-circuited paths. Thus, the low-frequency noise relative to the sensing pad does not tend to interfere with the RF node NRF and the RF signal source coupled thereto. According to practical measurements, such a design can well integrate the antenna structure with the sensing pad of the communication device 100, thereby significantly reducing the total size of the antenna structure and the sensing pad.

In some embodiments, the element sizes and element parameters of the communication device 100 are described as follows. The length LA of the first radiation element 110 (i.e., the length LA from the first end 111 to the second end 112) may be shorter than or equal to 0.25 wavelength ($\lambda/4$) of the first frequency band FB1 of the antenna structure. The length LB of the second radiation element 120 (i.e., the length LB from the first end 121 to the second end 122) and the length LC of the second radiation element 120 (i.e., the length LC from the first end 121 to the third end 132) may both be shorter than or equal to 0.25 wavelength ($\lambda/4$) of the second frequency band FB2 of the antenna structure. The width of the coupling gap GC1 between the first radiation element 110 and the second radiation element 120 may be shorter than or equal to 2 mm. The inductance of the first inductor L1 may be about 82 nH. The inductance of each of the second inductor L2 and the third inductor L3 may be from 180 nH to 220 nH. The capacitance of each of the first capacitor C1 and the second capacitor C2 may be lower than or equal to 15 pF. The above ranges of element sizes and element parameters are calculated and obtained according to many experiment results, and they help to optimize operation bandwidth, impedance matching, and detectable distance of the antenna structure and the sensing pad of the communication device 100.

Figure 3:
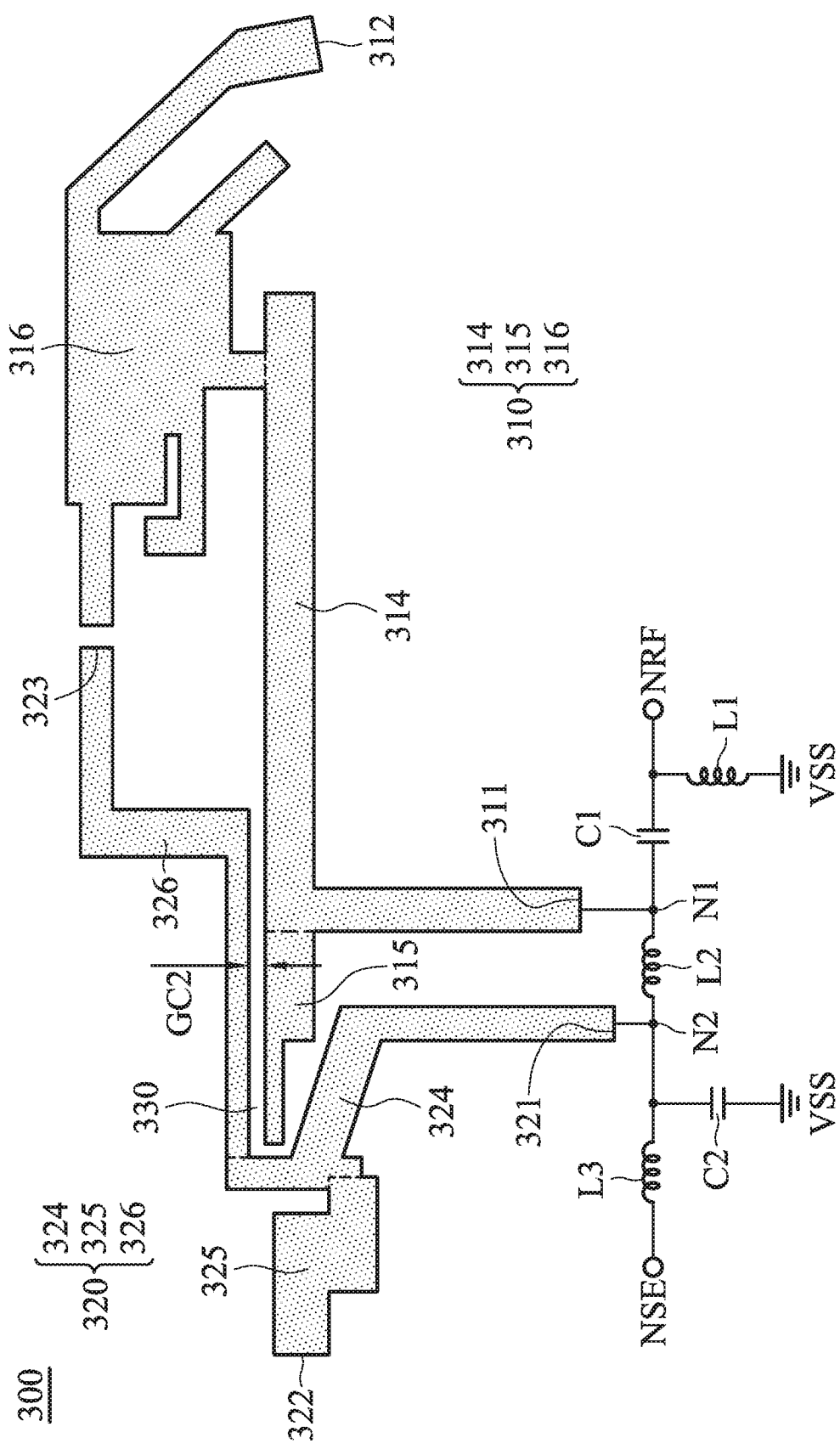
FIG. 3 is a diagram of a communication device according to another embodiment of the invention.

FIG. 3 is a diagram of a communication device 300 according to another embodiment of the invention. FIG. 3 is similar to FIG. 1. In the embodiment of FIG. 3, the communication device 300 with an RF node NRF and a detection node NSE includes a first radiation element 310, a second radiation element 320, a first inductor L1, a second inductor L2, a third inductor L3, a first capacitor C1, and a second capacitor C2. Similarly, an antenna structure and a sensing pad of the communication device 300 are formed by the first radiation element 310 and the second radiation element 320. It should be understood that the arrangements and connections of the first inductor L1, the second inductor L2, the third inductor L3, the first capacitor C1, and the second capacitor C2 have been described in the embodiment of FIG. 1. The first radiation element 310 has a first end 311 and a second end 312. The first end 311 of the first radiation element 310 is coupled to a first node N1. Specifically, the first radiation element 310 includes a first body portion 314 adjacent to the first end 311, a variable-width portion 315, and an impedance adjustment portion 316 adjacent to the second end 312. The first body portion 314 of the first radiation element 310 may substantially have an inverted L-shape. The variable-width portion 315 of the first radiation element 310 may substantially have a straight-line shape. The impedance adjustment portion 316 of the first radiation element 310 may substantially have an inverted H-shape. On the other hand, the second radiation element 320 has a first end 321, a second end 322, and a third end 323. The first end 321 of the second radiation element 320 is coupled to a second node N2. Specifically, the second radiation element 320 includes a second body portion 324 adjacent to the first end 321, a Z-shaped portion 325 adjacent to the second end 322, and an inverted N-shaped portion 326 adjacent to the third end 323. The second body portion 324 of the second radiation element 320 may substantially have a polyline-shape, and it may be positioned between the Z-shaped portion 325 and the inverted N-shaped portion 326 of the second radiation element 320. The second body portion 324 and the inverted N-shaped portion 326 of the second radiation element 320 can define a concave region 330 therebetween. The variable-width portion 315 of the first radiation element 310 at least partially extends into the concave region 330. Furthermore, a coupling gap GC2 may be formed between the inverted N-shaped portion 326 of the second radiation element 320 and the variable-width portion 315 of the first radiation element 310, such that the second radiation element 320 is excited by the first radiation element 310 using a coupling mechanism. According to practical measurements, such a design of the first radiation element 310 and the second radiation element 320 can further increase the operation bandwidth of the antenna structure, and minimize the total size of the sensing pad and the antenna structure. Other features of the communication device 300 of FIG. 3 are similar to those of the communication device 100 of FIG. 1. Accordingly, the two embodiments can achieve similar levels of performance.

The invention proposes a novel communication device for effectively integrating an antenna structure with a sensing pad. According to practical measurements, the invention can improve the operation performance of the antenna structure, and increase the probability of passing the SAR (Specific Absorption Rate) test. Therefore, the invention is suitable for application in a variety of small-size mobile communication devices.

Note that the above element sizes, element shapes, element parameters, and frequency ranges are not limitations of the invention. An antenna engineer can adjust these settings or values according to different requirements. It should be understood that the communication device of the invention is not limited to the configurations of FIGS. 1-3. The invention may merely include any one or more features of any one or more embodiments of FIGS. 1-3. In other words, not all of the features shown in the figures should be implemented in the communication device of the invention.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

It will be apparent to those skilled in the art that various modifications and variations can be made in the invention. It is intended that the standard and examples be considered as exemplary only, with a true scope of the disclosed embodiments being indicated by the following claims and their equivalents.

What is claimed is:

1. A communication device with an RF (Radio Frequency) node and a detection node, comprising:
   a first radiation element, coupled to a first node;
   a second radiation element, coupled to a second node;
   a first inductor, coupled between the RF node and a ground voltage;

a first capacitor, coupled between the RF node and the first node;

a second inductor, coupled between the first node and the second node;

a second capacitor, coupled between the second node and the ground voltage; and a third inductor, coupled between the detection node and the second node;

wherein an antenna structure and a sensing pad are formed by the first radiation element and the second radiation element.

2. The communication device as claimed in claim 1, wherein the second radiation element is adjacent to and separate from the first radiation element, such that the antenna structure is classified as a coupled-fed antenna structure.

3. The communication device as claimed in claim 1, wherein the first radiation element is a meandering structure.

4. The communication device as claimed in claim 1, wherein the second radiation element is a bifurcation structure.

5. The communication device as claimed in claim 1, wherein the second radiation element defines a concave region, and the first radiation element at least partially extends into the concave region.

6. The communication device as claimed in claim 1, wherein a coupling gap is formed between the second radiation element and the first radiation element, and a width of the coupling gap is shorter than or equal to 2 mm.

7. The communication device as claimed in claim 1, wherein the antenna structure covers a first frequency band and a second frequency band, the first frequency band is from 698 MHz to 760 MHz, and the second frequency band is from 1710 MHz to 2600 MHz.

8. The communication device as claimed in claim 7, wherein a length of the first radiation element is shorter than or equal to 0.25 wavelength of the first frequency band.

9. The communication device as claimed in claim 1, wherein an inductance of the first inductor is about 82 nH, and an inductance of each of the second inductor and the third inductor is from 180 nH to 220 nH.

10. The communication device as claimed in claim 1, wherein a capacitance of each of the first capacitor and the second capacitor is lower than or equal to 15 pF.

\* \* \* \* \*